(12) United States Patent
Imai et al.

(10) Patent No.: US 8,134,166 B2
(45) Date of Patent: Mar. 13, 2012

(54) LIGHT EMITTING DEVICE AND METHOD FOR PRODUCING THE LIGHT EMITTING DEVICE

(75) Inventors: Yuji Imai, Kanzaki-gun (JP); Satoshi Kamiyama, Nagoya (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 247 days.

(21) Appl. No.: 12/498,738

(22) Filed: Jul. 7, 2009

(65) Prior Publication Data
US 2010/0006871 A1    Jan. 14, 2010

(30) Foreign Application Priority Data

Jul. 8, 2008    (JP) .................................. 2008-178140
Jul. 15, 2008    (JP) .................................. 2008-183557

(51) Int. Cl.
*H01L 33/00* (2010.01)
*H01L 21/50* (2006.01)

(52) U.S. Cl. ................... 257/89; 438/29; 257/E33.061; 257/E21.499

(58) Field of Classification Search ............ 257/89, 257/E33.061, E21.499; 438/29
See application file for complete search history.

(56) References Cited

U.S. PATENT DOCUMENTS

| 6,504,179 | B1 | 1/2003 | Ellens et al. |
| 7,318,651 | B2 * | 1/2008 | Chua et al. ...................... 362/11 |
| 7,528,077 | B2 * | 5/2009 | Izuno et al. .................... 438/778 |
| 2004/0217364 | A1 * | 11/2004 | Tarsa et al. ..................... 257/89 |
| 2005/0093116 | A1 * | 5/2005 | Palmteer et al. ............. 257/676 |
| 2007/0176531 | A1 * | 8/2007 | Kinoshita et al. ............. 313/486 |

FOREIGN PATENT DOCUMENTS

JP    2008-85324 A    4/2008
* cited by examiner

*Primary Examiner* — Matthew W Such
*Assistant Examiner* — Monica D Harrison
(74) *Attorney, Agent, or Firm* — Roberts, Mlotkowski, Safran & Cole, P.C.; David S. Safran

(57) ABSTRACT

A light emitting device that has a radiant efficiency that does not decline in use, enables luminous flux to be increased by a high electric current, and produces white light with good color rendering and a method for producing a light emitting device capable of smoothly transmitting heat generated by LED elements to a carrier substrate. The radiation emitting device has first LED elements for emitting UV radiation, second LED elements for emitting visible light, a substrate made of an inorganic material and which carries the first LED elements and the second LED elements, a body made of inorganic material containing the first LED elements, the second LED elements and the substrate, and an SiC fluorescent screen that is doped with at least one of B and Al as well as N and emits visible light when excited by radiation emitted from the first LED elements.

11 Claims, 9 Drawing Sheets

Fig. 3 (a)
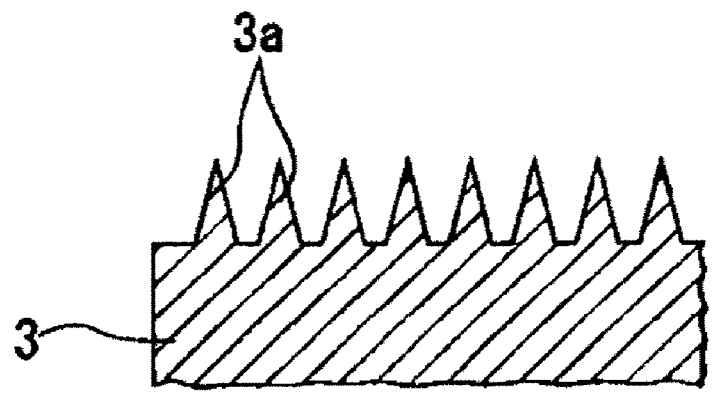
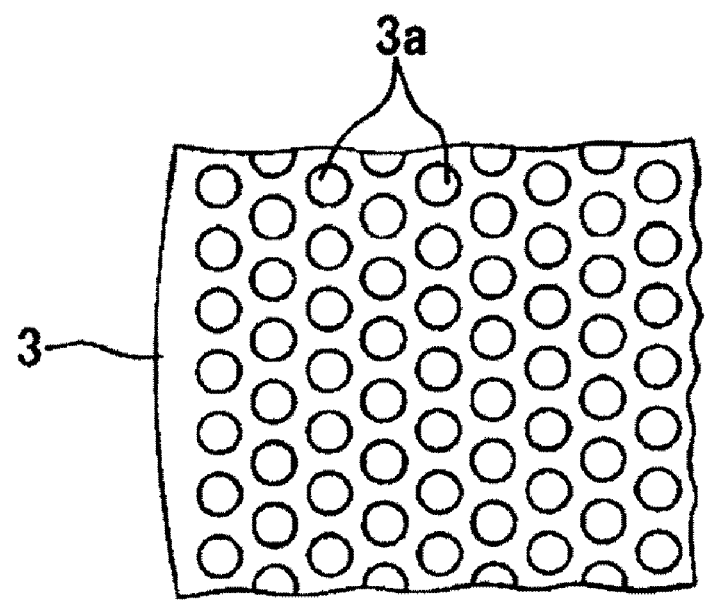
Fig. 3 (b)

US 8,134,166 B2

LIGHT EMITTING DEVICE AND METHOD FOR PRODUCING THE LIGHT EMITTING DEVICE

BACKGROUND OF THE INVENTION

1. Field of Invention

This invention relates to a light emitting device that is provided with LED elements and emits white light.

2. Description of Related Art

A light emitting device has conventionally been known that emits white light by combining an LED element and fluorescent material (see, e.g., Japanese Patent Application Publication No. 2003-535478 and corresponding U.S. Pat. No. 6,504,179). The light emitting device described in this document is provided with an LED element that emits radiation of 300-470 nm and generates white light as a result of this light being converted into light having a longer wavelength fully or partially by the fluorescent material excited by this radiation. The fluorescent material is dispersed in sealing resin that seals the LED element.

A light emitting device has also been known that can generate white light by combining a red LED element, a green LED element and a blue LED element (See, e.g., Japanese Laid-open Application No. 2008-085324). However, in the light emitting device described in Japanese Patent Application Publication No. 2003-535478 and corresponding U.S. Pat. No. 6,504,179, the heat resistance of the fluorescent material is low in the sealing resin, and the emission efficiency of the light emitting device declines when the temperature of the device increases when in use. Moreover, since the heat quantity of an LED element is restricted, it is difficult to increase luminous flux by flowing a high electric current to the LED element.

As shown in the light emitting device described in Japanese Laid-open Application No. 2008-085324, it may be possible to generate white light using red, green blue LED elements in place of a fluorescent material. However, the full width at half maximum of each LED element is extremely small compared with that of a fluorescent material, the color rendition of white light generated declines. Furthermore, in the body that the heat quantity of an LED element is not restricted, it becomes necessary to smoothly transmit heat generated at each element to a substrate on which the element is carried.

SUMMARY OF THE INVENTION

The present invention was made in view of the abovementioned circumstances. Thus, an object of the invention is to provide a light emitting device that does not reduce radiant efficiency when in use, enables to increase luminous flux by flowing a high electric current to LED elements, and produces white light of good color rendition.

Another object of the invention is to provide a light emitting device capable of smoothly transmitting heat generated by an LED element to a substrate as well as a method for producing it.

In order to solve the abovementioned problems, in accordance with a first aspect the present invention provides a light emitting device having first LED elements for emitting UV radiation, second LED elements for emitting visible light, a substrate that carries the first LED elements and the second LED elements and is made of inorganic material, a body that contains the first LED elements, the second LED elements and the substrate and is made of inorganic material, and an SiC fluorescent screen that is doped with at least one of B and Al as well as N and emits visible light when excited by radiation emitted from the first LED elements.

In the above-mentioned first aspect, the first LED elements emit radiation of 408 nm or shorter in peak wavelength, and the second LED elements emit radiation that exceeds 408 nm in peak wavelength.

In the abovementioned first aspect, the body has an opening, and the SiC fluorescent screen is provided on the opening.

In the above-mentioned first aspect, the SiC fluorescent screen has a periodic structure formed in a manner of having a period shorter than the emission wavelength of the first LED elements on the surface on which radiation emitted from the first LED elements are incident.

In the above-mentioned first aspect, a lens made of inorganic material is provided outside the SiC fluorescent screen in the opening.

In order to solve the above-mentioned problems, according to a second aspect, the present invention provides a light emitting device having UV elements for emitting UV radiation, blue LED elements for emitting blue light, green LED elements for emitting green light, red LED elements for emitting red light, a substrate that carries the UV LED elements, the blue LED elements, the green LED elements and the red LED elements and is made of inorganic material, a body that contains the UV LED elements, the blue LED elements, the green LED elements, the red LED elements and the substrate and is made of inorganic material, and an SiC fluorescent screen that is doped with at least one of B and Al as well as N and emits visible light when excited by radiation emitted from the UV LED elements.

In order to solve the above-mentioned problems, according to a third aspect, the present invention provides a light emitting device comprising first LED elements for emitting UV radiation, second LED elements for emitting visible light, an SiC fluorescent screen that is doped with at least one of B and Al as well as N and emits visible light when excited by radiation emitted from the first LED elements, a substrate that carries the first LED elements and the second LED elements and is made of inorganic material, and an AuSn type alloy layer that binds the first LED elements and the second LED elements with the substrate and comprises columnar crystals extending substantially in the perpendicular direction relative to the substrate.

The above-mentioned third aspect is characterized by having a body that contains the substrate and is made of inorganic material.

In the above-mentioned third aspect, the peak wavelength of the first LED elements is 408 nm or shorter, and the peak wavelength of the second LED elements exceeds 408 nm.

In the above-mentioned third aspect, the second LED elements are of three types of LED elements, i.e., blue LED elements, green LED elements and red LED elements.

The method for producing the above-mentioned light emitting device according to the third aspect has a Sn film forming step of forming a Sn film on the carrying surface of the substrate, an Au film forming step of forming an Au film on the mounting surface of the first LED elements and the second LED elements, a contacting step of contacting the Au film formed on the first LED elements and the second LED elements to the surface of the Sn film formed on the carrying surface of the substrate, and a binding step of binding the first LED elements and the second LED elements to the substrate by heating the substrate in an atmosphere of forming gas containing a mixed gas of hydrogen gas and nitrogen gas in the state that the Sn film and Au film are contacted to each other.

Particularly, in the method for producing the abovementioned light emitting device according to the third aspect, the Sn film and the Au film are contacted to each other in the contacting process by placing the carrying surface of the substrate upward and the mounting surface of the first LED elements and the second LED elements downward, and then mounting the first LED elements and the second LED elements on the substrate, and the first LED elements and the second LED elements are bound to the substrate in the binding step by heating the substrate in a state of mounting the first LED elements and the second LED elements on the substrate.

According to the present invention, since an SiC fluorescent screen has a high heat resistance property, the emission efficiency does not decline when in use, unlike a conventional device. Moreover, since the heat resistance of the device increases as a whole, it becomes possible to increase luminous flux by delivering a high electric current to the LED elements. Furthermore, white light of good color rendition can be generated because an SiC fluorescent screen can emit radiation having a large full width at half maximum compared with that of LED elements and the like when excited by radiation emitted from the first LED elements.

Furthermore, heat generated from each LED element can smoothly be transmitted to a substrate because the substrate is bound to each element by an AuSn type alloy layer having columnar crystals.

BRIEF DESCRIPTION OF DRAWINGS

FIG. 3(a) is an enlarged partial vertical sectional view of the SiC fluorescent screen in the light emitting device of FIGS. 1 and 2; and FIG. 3(b) is a partial plan view of the SiC fluorescent screen.

FIG. 5(a) is a plan view of the carrier substrate before LED elements are mounted; FIG. 5(b) is a side view of the carrier substrate at the time of mounting the LED elements; and FIG. 5(c) is a side view of the carrier substrate after LED elements have been mounted.

DETAILED DESCRIPTION OF THE INVENTION

Figure 1:
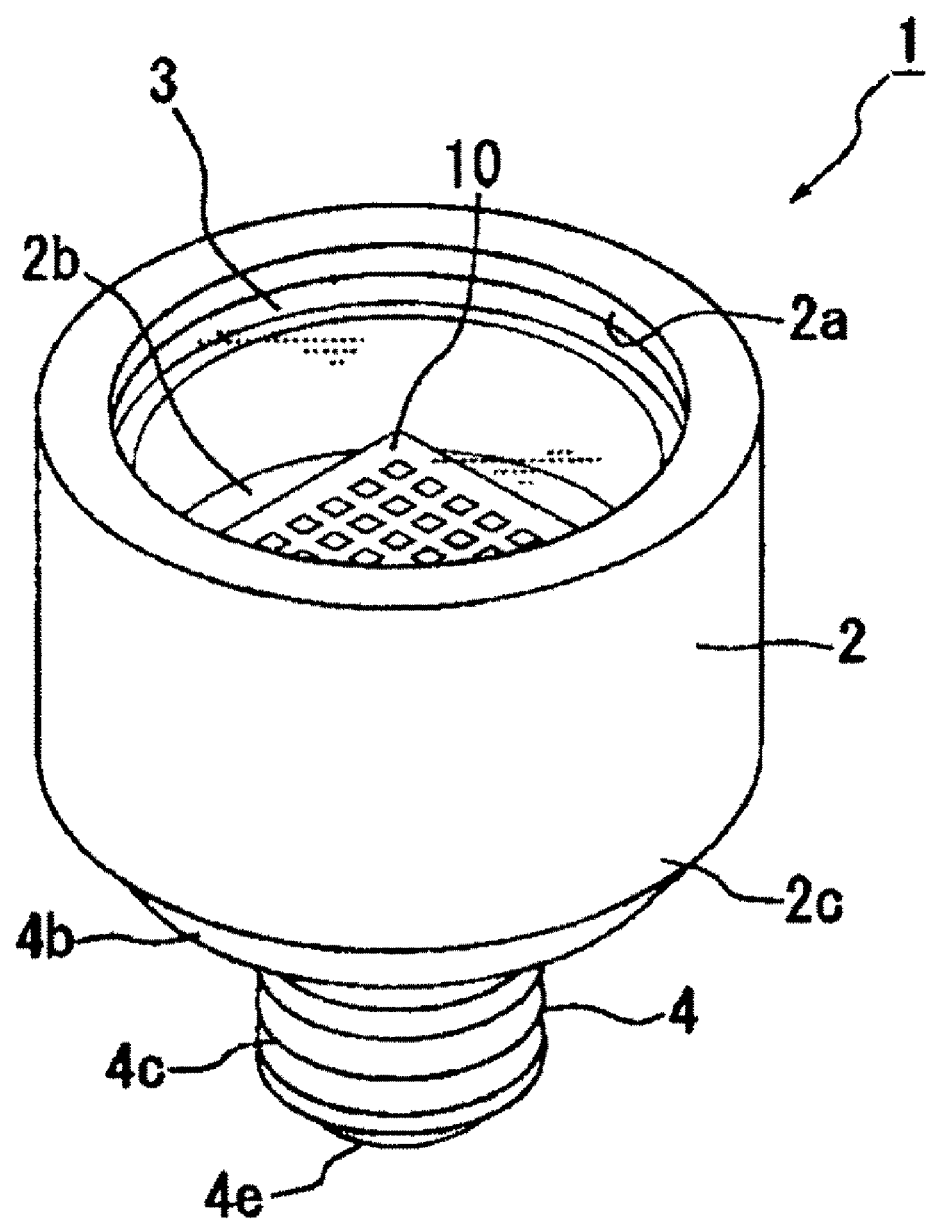
FIG. 1 is a perspective view of a first embodiment of a light emitting device according to the present invention.

As shown in FIG. 1, a light emitting device 1 has a cylindrical body 2 with an opening 2a formed on one end, an SiC fluorescent screen for closing the opening 2a, and an electric terminal part 4 formed on the other end of the body 2. In the present embodiment, a description is given such that the one end of the body 2 is in the upward direction and the other end in the downward direction. In the body 2 are contained multiple types of LED elements to which electric power is supplied from the electric terminal part 4. A SiC fluorescent screen 3 is excited by UV radiation emitted from the LED elements to emit light. Blue light, green light and red light emitted from the LED elements pass through the SiC fluorescent screen 3 without going through any conversion in their wavelengths.

Figure 2:
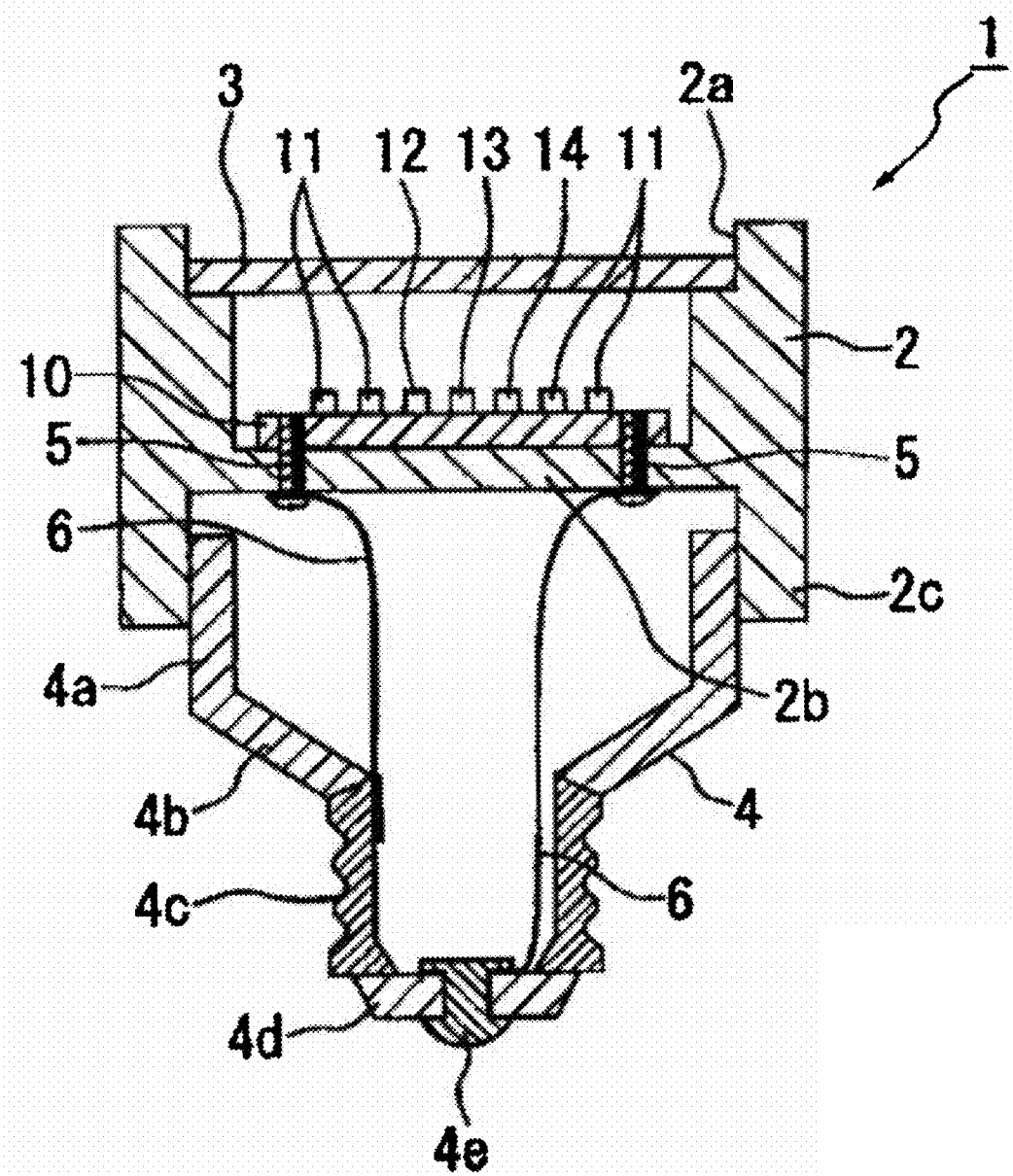
FIG. 2 is a schematic vertical sectional view of the light emitting device according to FIG. 1.

FIG. 2 is a schematic vertical sectional view of the light emitting device.

The body 2 shown in FIG. 2 is made of inorganic material. Its lower end is closed off, and the closed part constitutes a bottom part 2b. The body 2 is made of ceramics, which is AlN in the present embodiment. On the bottom part 2b is fixed a carrier substrate 10 on which UV LED elements 11, blue LED elements 12, green LED elements 13 and red LED elements 14 are mounted. Any suitable method may be used for fixing the carrier substrate 10. In the present embodiment, the carrier substrate 10 is fixed with screws that are screwed into the bottom part 2b. In the opening 2a of the body 2 a step is formed, and the SiC fluorescent screen 3 is fixed on the step part. Moreover, the body 2 has a flange 2c that protrudes downward from the bottom part 2b. In the present embodiment, the flange 2c is formed in the circumferential direction.

The electric terminal part 4 is made of inorganic material and constituted in a manner for being screwed into a given socket used for supplying electric power. The electric terminal part 4 has a cylindrical part 4a that is fixed on the inner circumference of the flange 2c, a sloping part 4b that is formed continuously from the lower end of the cylindrical part 4a and tapers off downward, a first electrode part 4c that is provided on the lower end of the sloping part 4b and has an external surface on which a male screw is formed, an insulating part 4d that is formed continuously from the lower end of the first electrode part 4c and extends inward in the radial direction, and a second electrode 4e that closes off the inner side of the insulating part 4d in the radial direction. The cylindrical part 4a, the sloping part 4b and the insulating part 4d are made of ceramics that have insulating properties. The first electrode 4c and the second electrode 4e are made of metal that has conductive properties. The cylindrical part 4a, the sloping part 4b and the insulating part 4d are preferably made of the same material as that of the body 2. The first electrode 4c and the second electrode 4e are electrically connected to a respective one of the screws 5 by internal electric leads 6. In the present embodiment, the screws 5 are made of conductive metal and are electrically connected to a wiring pattern of the carrier substrate 10 when it is screwed into the carrier substrate 10.

The SiC fluorescent screen 3 is made of 6H type SiC crystals having a periodic structure every six layers and formed in the shape of a plate. The SiC fluorescent screen 3 contains N as donor impurities as well as Al and B as acceptor impurities. The SiC fluorescent screen 3 is doped with Al having a concentration of $2 \times 10^{18}$ cm$^{-3}$, for example, B having a concentration of $1 \times 10^{19}$ cm$^{-3}$, for example, and N having a concentration of $5 \times 10^{19}$ cm$^{-3}$, for example. Although any concentration is acceptable for Al, B and N, the sum of the concentrations of Al and B must be smaller than the concentration of N in order to excite and emit light from the SiC fluorescent screen 3. The SiC fluorescent screen 3 emits fluorescent light as a result of the recombination of donors and acceptors when excited by UV radiation. The SiC fluorescent screen 3 can be produced by any suitable method.

For example, it can be produced by growing SiC crystals by the sublimation method or the chemical vapor deposition method. In this body, the concentration of nitrogen can be set in any way in the SiC fluorescent screen 3 by properly adjusting the partial pressure of nitrogen gas ($N_2$) in the atmosphere while growing the crystals. On the other hand, the concentrations of Al and B can be set in any way in the SiC fluorescent screen 3 by mixing proper amounts of Al and B singly or proper amounts of an Al compound and a B compound relative to that of raw material.

As shown in FIG. 3(a), the SiC fluorescent screen 3 has a predetermined periodic structure on its front surface and rear surface. The periodic structure is constituted of a large number of convex parts 3a substantially having a cone shape. Convex parts 3a are periodically arranged along the front surface and the rear surface. The shape of each convex part 3a may be a polygonal pyramid, such as a triangular pyramid and a quadrangular pyramid.

As shown in FIG. 3(b), convex parts 3a are arranged in a triangle lattice shape at a predetermined period in a plan view. Although any average period is acceptable for convex parts 3, it is 200 nm in the present embodiment. The average period is defined as an average peak distance between convex parts 3a that are adjacent to each other. Each convex part 3a substantially has a cone shape: an average bottom diameter is 150 nm and an average height 400 nm. Thus, reflection can be prevented on the boarder surface between the SiC fluorescent screen 3 and air by forming a sufficiently small periodic structure compared with the optical wavelength of transmitted light. Accordingly, near ultraviolet radiation and visible light emitted from each LED element 11, 12, 13 or 14 can efficiently be made incident on the SiC fluorescent screen 3, and visible light can efficiently be exited from the SiC fluorescent screen 3.

Figure 4:
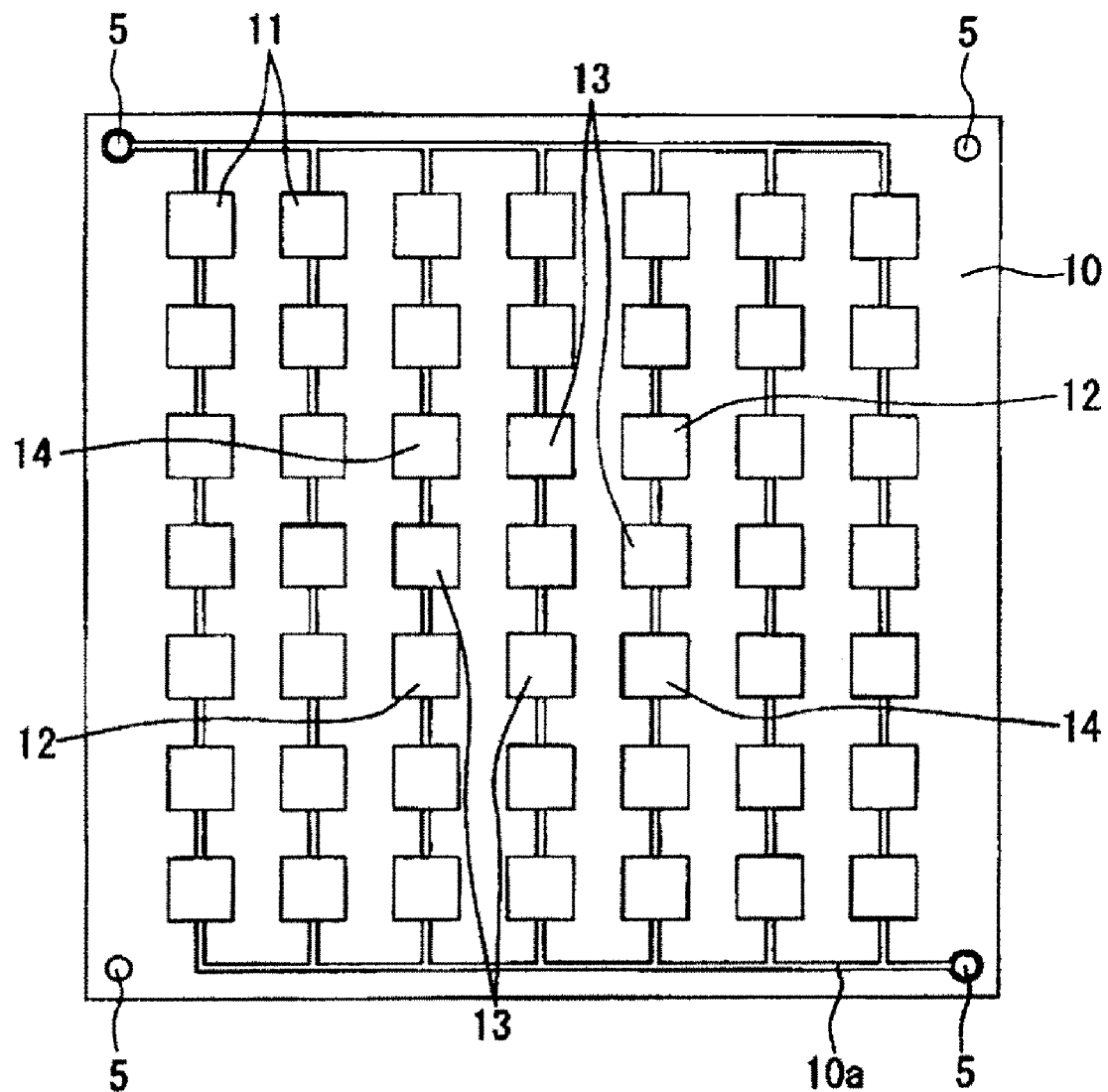
FIG. 4 is a schematic plan view of the carrier substrate of the first embodiment.

As shown in FIG. 4, the carrier substrate 10 has a square shape in a plan view. LED elements 11, 12, 13, 14 are arranged horizontally and vertically at predetermined intervals. In the present embodiment, each LED element 11, 12, 13, 14 is about 350 μm by 350 μm square in a plan view. The distance between LED elements 11, 12, 13, 14 is about 20 μm. In the present embodiment, LED elements 11, 12, 13, 14 are not sealed. Moreover, in the present embodiment, 49 LED elements 11, 12, 13, 14 are mounted on the carrier substrate 10 (7 columns×7 rows). More specifically, the substrate 10 carries 41 UV LED elements 11, 2 blue LED elements 12, 4 green LED elements 13, and 2 red LED elements 14.

As a first LED element, the UV LED elements 11 emit radiation having a peak wavelength of 380 nm, for example. As a second LED element, the blue LED elements 12 emit light having a peak wavelength of 450 nm, for example. As a second LED element, the green LED elements 13 emit light having a peak wavelength of 550 nm, for example. As a second LED element, the red LED elements 14 emit light having a peak wavelength of 650 nm, for example. Material properties are not particularly restricted for the LED elements 11, 12, 13, 14. For example, the following materials may be used: AlInGaN, AlGaN, InGaN, GaN, ZnSe, GaP, GaAsP, AlGaInP, AlGaAs and others.

The carrier substrate 10 is made of inorganic material that has insulating properties. On its surface a wiring pattern 10a is formed. Preferably, the carrier substrate 10 is made of a ceramic material. In the present embodiment, AlN is used. The carrier substrate 10 may also be formed of Si, SiC or the like, for example. Wavelength conversion SiC that is doped with an impurity acceptor and an impurity donor is also acceptable. Moreover, the carrier substrate 10 is tightly attached to the body 2 with a screw 5 at each of its four corners. Of the four screws 5, two diagonally placed screws are electrically connected with the wiring pattern 10a.

Figure 5:
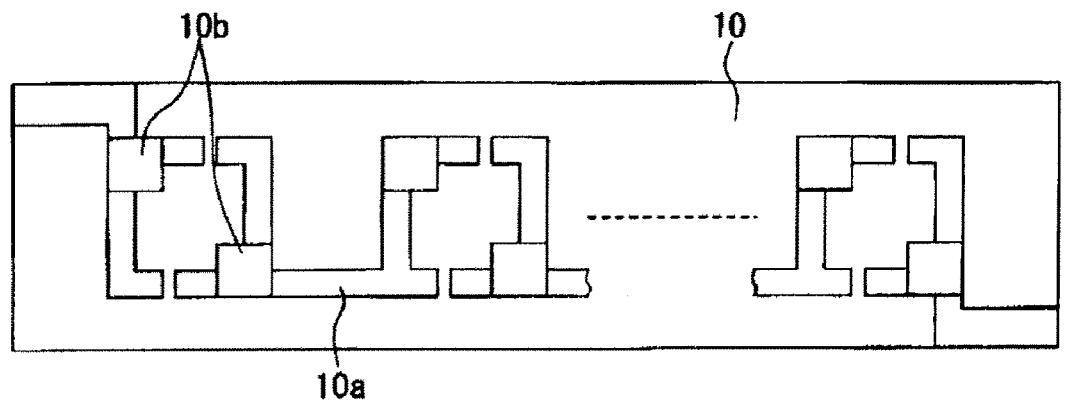
FIGS. 5(a)-5(c) are an explanatory views showing the mounting of LED elements onto the carrier substrate in the first embodiment.
Figure 5:
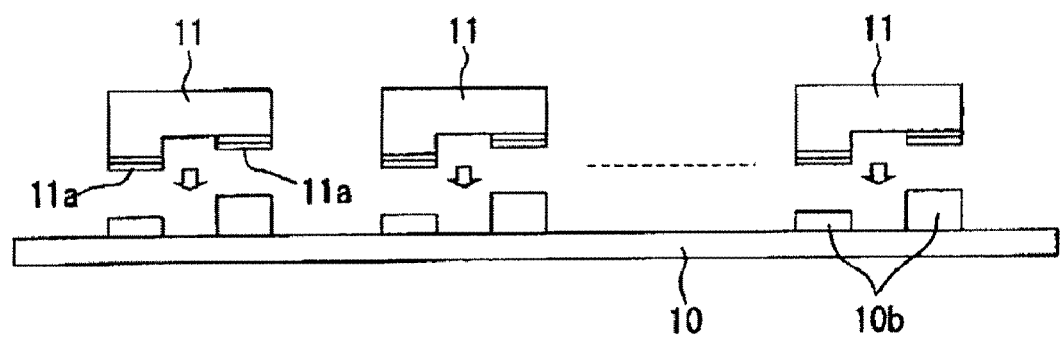
Figure 5:
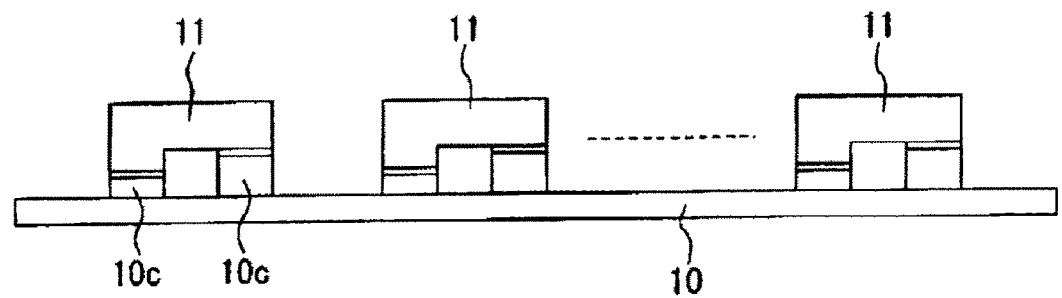

FIGS. 5(a)-5(c) are explanatory views showing the mounting of LED elements onto the carrier substrate; FIG. 5(a) is a plan view of a carrier substrate before LED elements are mounted; FIG. 5(b) is a side view of the carrier substrate at the time of mounting the LED elements; and FIG. 5(c) is a side view of the carrier substrate after LED elements have been mounted.

As shown in FIG. 5(a), a wiring pattern 10a made of Sn is formed on the carrier substrate 10. An Sn film 10b is formed at a position where wiring pattern 10a is electrically connected to each LED element 11. In FIG. 5(a), flip chip type LED elements 11 are illustrated.

On the other hand, as shown in FIG. 5(b), an Au film 11a is formed on a pair of electrodes of each LED element. As shown by an arrow in FIG. 5(b), each LED element is mounted on the Sn film 10b of the carrier substrate 10 with the Au film 11a facing downward. In this state, the carrier substrate 10 is heated in an atmosphere in which forming gas containing a mixture of hydrogen gas and nitrogen gas is flowing in order to bind each LED chip 11 to the carrier substrate 10. As a result, as shown in FIG. 5(c), each LED chip 11 is connected to the wiring pattern 10a of the carrier substrate 10 through an AuSn alloy 10c.

In producing a light emitting device, each LED element 11, 12, 13, 14 is mounted on the carrier substrate 10 by the following steps:

an Sn film forming step of forming an Sn film 10b on the carrying surface of the carrier substrate 10;

an Au film forming step of forming an Au film 11a on the mounting surface of each LED element 11, 12, 13, 14;

a contacting step of contacting the Au film 11a formed on each LED element 11, 12, 13, 14 to the surface of the Sn film 10b formed on the carrying surface of the carrier substrate 10; and a binding step of binding each LED element 11, 12, 13, 14 to the carrier substrate 10 by heating the carrier substrate 10 in an atmosphere of forming gas containing a mixed gas of hydrogen gas and nitrogen gas in a state that the Sn film 10b and Au film 11a are in contact with each other.

In the present embodiment, the Sn film 10b and the Au film 11a are contacted with each other in the contacting step by moving the carrying surface of the carrier substrate 10 upward and the mounting surface of each LED element 11, 12, 13, 14 downward, and then, mounting each LED element 11, 12, 13, 14 on the carrier substrate 10. In the bonding step, each LED element 11, 12, 13, 14 is bound to the carrier substrate 10 by heating the carrier substrate 10 in a state that each LED element 11, 12, 13, 14 is mounted on the carrier substrate 10.

Specifically, as shown in FIG. 5(a), a wiring pattern 10a made of Sn, for example, is formed on the carrier substrate 10 made of inorganic material. The Sn film 10b is formed at a position of the carrying surface where each LED element is to be electrically connected. This Sn film is formed by an EB deposition method (i.e., electron beam deposition method), for example, and is 1 to 8 μm in film thickness (e.g., 3 μm). The flip chip type is illustrated for each LED element 11 in FIG. 5(a).

On the other hand, as shown in FIG. 5(b), an Au film 11a is formed on a pair of electrodes of each LED element 11 as the mounting surface. This Au film is formed by the EB deposition method, for example, and is 0.1 to 1.0 μm in film thickness (e.g., 0.2 μm). As shown by the arrow in FIG. 5(b), each LED element 11 is mounted on the Sn film 10b of the carrier substrate 10 by moving the Au film 11a downward.

Then, the carrier substrate 10 on which LED elements 11, 12, 13, 14 are mounted is placed in a thermal processing container. An AuSn type alloy layer 10c alloyed from Sn and Au is formed by heating the carrier substrate 10 in an atmosphere in which forming gas containing a mixture of hydrogen gas and nitrogen gas is flowing. The percentage of hydrogen gas contained in this forming gas is less than 10% (e.g., 5%). The flow rate of the forming gas is 50 to 350 cm$^3$/min (e.g., 300 cm$^3$/min). The thermal processing conditions are as follows: the heating temperature is 250-350° C. (e.g., 300° C.) and the processing time 1-20 minutes (e.g., 10 minutes). As a result, as shown in FIG. 5(c), each LED chip 11 is bound to the carrier substrate 10 through the AuSn type alloy layer 10c. In the present embodiment, the AuSn type alloy layer 10c is formed by the weight of LED elements 11, 12, 13, 14. However, each LED element 11, 12, 13, 14 may be subject to a pressure of 10-50 g/cm$^2$, for example. Subsequently, the carrier substrate 10 is fixed on the bottom part 2b of the body 2 with screws 5. Then, the electric terminal part 4 is connected to the flange 2c of the body 2, and the carrier substrate 10 and the electrode parts 4c, 4e are electrically connected to each other with an internal electric lead 6. In this manner, the light emitting device is made.

Thus, in binding LED elements 11, 12, 13, 14 to the carrier substrate 10, it is not necessary to form an alloy layer made of AuSn alloy on the carrier substrate 10 and each LED chip 11, 12, 13, 14 in advance. Moreover, since each LED element 11, 12, 13, 14 is bound to the carrier substrate 10 by the weight of each LED element 11, 12, 13, 14, it is not necessarily needed to pressurize each LED element 11, 12, 13, 14, thereby suppressing any harmful influence arising out of pressurization. Moreover, since columnar crystals are formed in the AuSn alloy 10c, LED elements 11, 12, 13, 14 can have high emission efficiency for an electric current, whereby excellent heat resistance and heat conductivity are provided to the joining area by AuSn alloy 10c.

In the light emitting device having the above-mentioned constitution, electric power can be supplied to LED elements 11, 12, 13, 14 by screwing the electric terminal part 4 into an external socket. When an electric current is applied to LED elements 11, 12, 13, 14, radiation having a predetermined wavelength is emitted from those LED elements 11, 12, 13, 14.

UV radiation emitted from a UV LED element 11 is incident on the SiC fluorescent screen 3 from its rear surface and exits from the front surface of the SiC fluorescent screen 3 after it is absorbed by the SiC fluorescent screen 3 and converted into white light. In this body, light is emitted by a donor-acceptor pair inside the SiC fluorescent screen 3 using UV radiation as excitation radiation. In the present embodiment, Al and B are doped as acceptors, and pure white color is emitted by light having a broad wavelength spanning from the blue region to the red region with a peak wavelength in the green region. With the emission of this pure white color, it is possible to generate white light having a higher color rendering than that generated by a conventional light emission device that combines a blue LED element and a yellow fluorescent screen.

Visible light emitted from LED elements 11, 12, 13, 14 other than UV LED elements 11 (blue light, green light and red light in the present embodiment) is incident on the SiC fluorescent screen 3 from its rear surface and then exits form the front surface of the SiC fluorescent screen 3 without going through any conversion in its wavelength. This is because the SiC fluorescent screen 3 is excited by radiation having a wavelength of 408 nm or shorter and is transparent to light that exceeds 408 nm in its wavelength.

Since a periodic structure is formed on the front surface and rear surface of the SiC fluorescent screen 3, the reflection of radiation incident on the screen from the side of the carrier substrate 10 as well as the reflection of radiation that exits to the outside can be prevented on the boarder surface between the SiC fluorescent screen 3 and air. Accordingly, light can be emitted to the outside accurately even if the body 2 is filled with air whose refractive index is lower than that of SiC.

Thus, by supplying power to the LED elements 11, 12, 13, 14, a mixed radiation of white light generated by fluorescent light of the SiC fluorescent screen 3 and blue light, green light and red light that pass through the SiC fluorescent screen 3 can be emitted to the outside. Accordingly, a blue component, a green component and a red component can be provided by blue LED elements 12, green LED elements 13 and red LED elements 14 in addition to the pure white fluorescent light of the SiC fluorescent screen 3, thereby generating white light having an extremely high color rendering.

According to our experiments, the luminous flux generated by 41 UV LED 11 was about 280 lm and the luminous flux generated by 2 blue LED elements 12, 4 green LED elements 13 and 2 red LED elements about 20 lm, totaling a luminous flux of about 300 lm. The conditions of supplying power to the LED elements 11, 12, 13, 14 were as follows: voltage: 3V; electric current: 20 mA; and temperature of the carrier substrate 10: about 70° C.

In the present embodiment, a viewer can perceive that the exited white light is brighter because the number of green LED elements 13 is larger than the number of blue LED elements 12 as well as the number of red LED elements 14. This is because the visual sensitivity of humans is the highest in the green region.

Furthermore, at a time when each LED element 11, 12, 13, 14 emits light, each LED element 11, 12, 13, 14 generates heat. Since inorganic material is used for the body 2, the SiC fluorescent screen 3, the electric terminal part 4, the carrier substrate 10, and the like in the light emitting device 1 according to the present embodiment, heat resistance is highly advanced compared with a conventional light emitting device having fluorescent material contained in the sealing resin of an LED element or using a lens made of resin. Accordingly, it is possible to eliminate a heat discharging mechanism that is conventionally needed and to increase the luminous flux by increasing the electric power for the LED elements 11, 12, 13, 14, which is extremely advantageous at the time of practical use. In view of heat resistance, it is preferred to not use any resin in the light emitting device 1.

Because each LED element 11, 12, 13, 14 and the carrier substrate 10 are connected to each other by the AuSn type alloy layer 10c in the light emitting device 1 according to the present invention, heat generated in each LED element 11, 12, 13, 14 is smoothly transmitted to the carrier substrate 10. The heat transmitted to the carrier substrate 10 is transmitted to the body 2 from the carrier substrate 10 and dissipated to the ambient air.

Moreover, since the insulating portion of the electric terminal part 4, the body 2 and the carrier substrate 10 are made of the same material, internal stress caused by differences in thermal expansion coefficients of the parts can be reduced at a time when heat is generated. Although screws 5 made of metal are used for connecting the bottom part 2b of the body 2 with the carrier substrate 10, stress caused by the difference in thermal expansion coefficients is so relatively small that the screws 5 are not damaged because the extending direction of the bottom part 2b and the carrier substrate 10 (horizontal direction) and the extending direction of the screws 5 (vertical direction) are perpendicular to each other.

Figure 6:
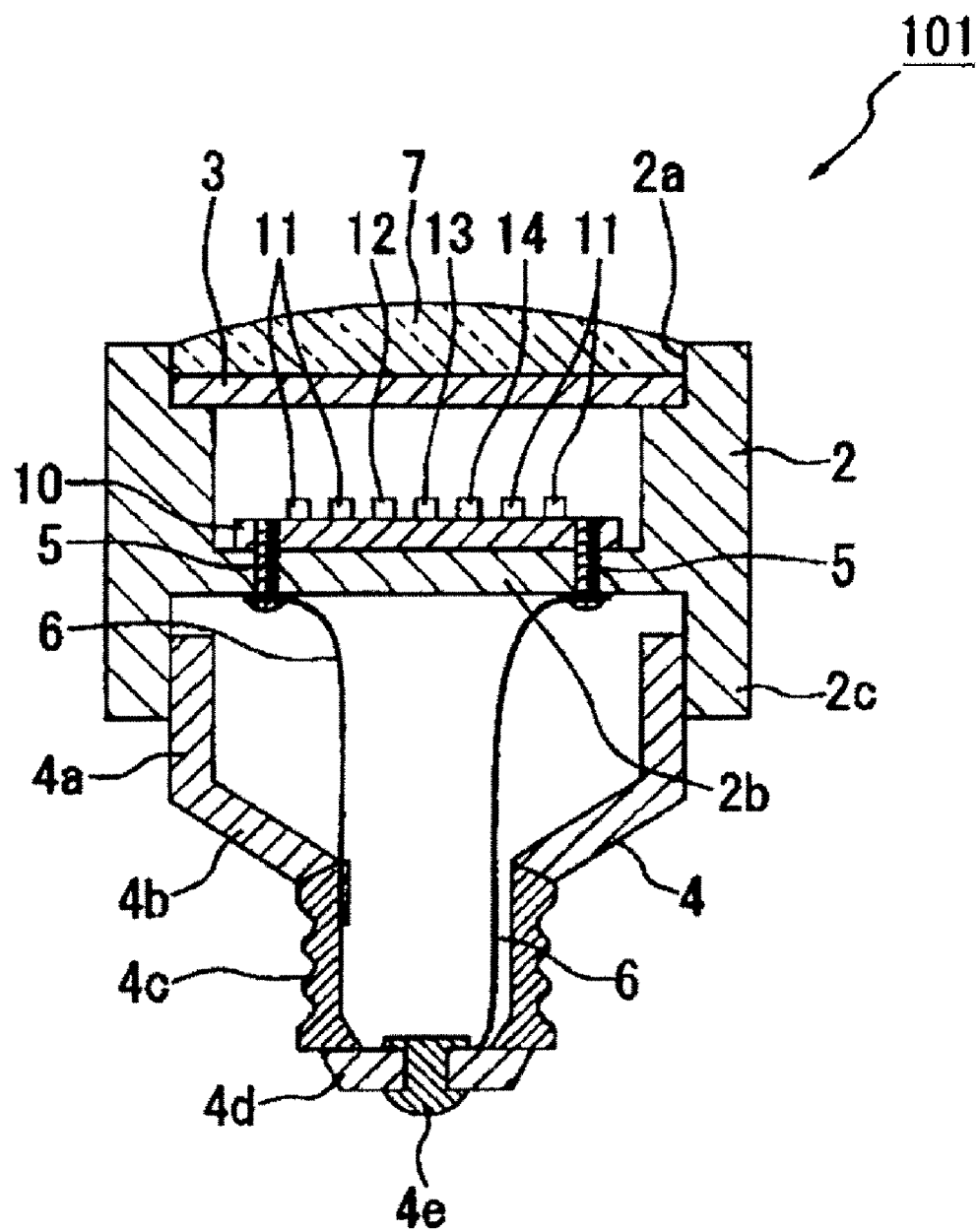
FIG. 6 is a schematic vertical sectional view of another embodiment of the light emitting device.

In the abovementioned embodiment, as shown in FIG. 6, a lens 7 made of inorganic material may be provided in the opening 2a of the body 2. In the light emitting device 101 as shown in FIG. 6, the lens 7 is made of glass and disposed on the outside of the SiC fluorescent screen 3. The exiting surface of the lens 7 has an outwardly (upward) convex shape so that light exiting from the body 2 can be converged. Because the lens 7 is made of inorganic material, this light emitting device 101 has a high heat resistance as well.

Figure 7:
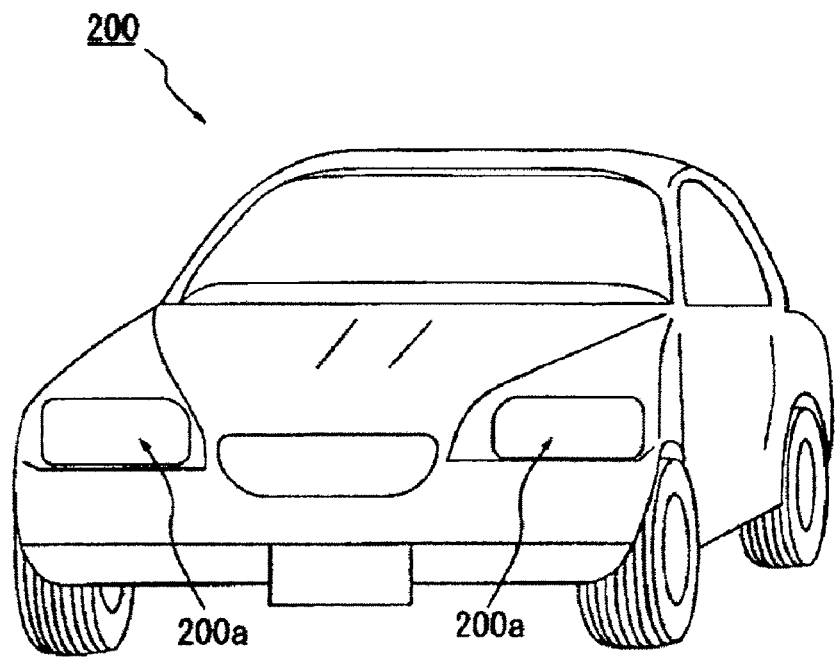
FIG. 7 is a schematic depiction of the front of an automobile with headlights incorporating light emitting devices according to the present invention.
Figure 8:
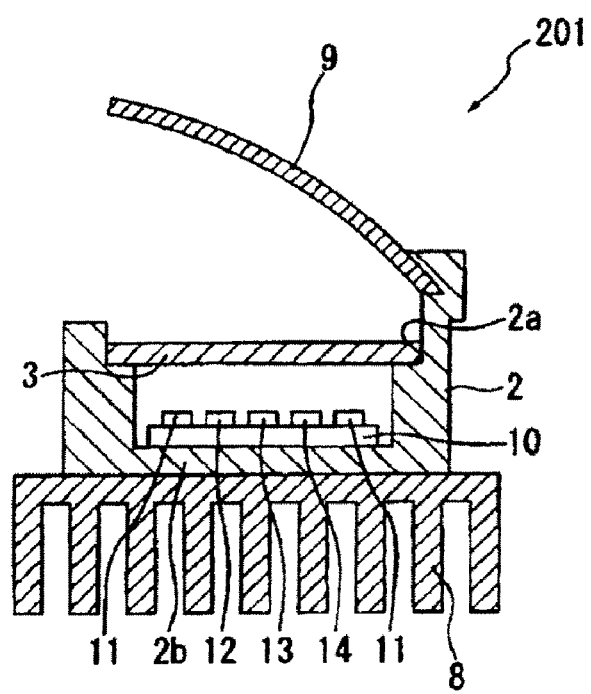
FIG. 8 is a schematic vertical sectional view of another embodiment of a light emitting device for use in the headlights of FIG. 7.
Figure 9:
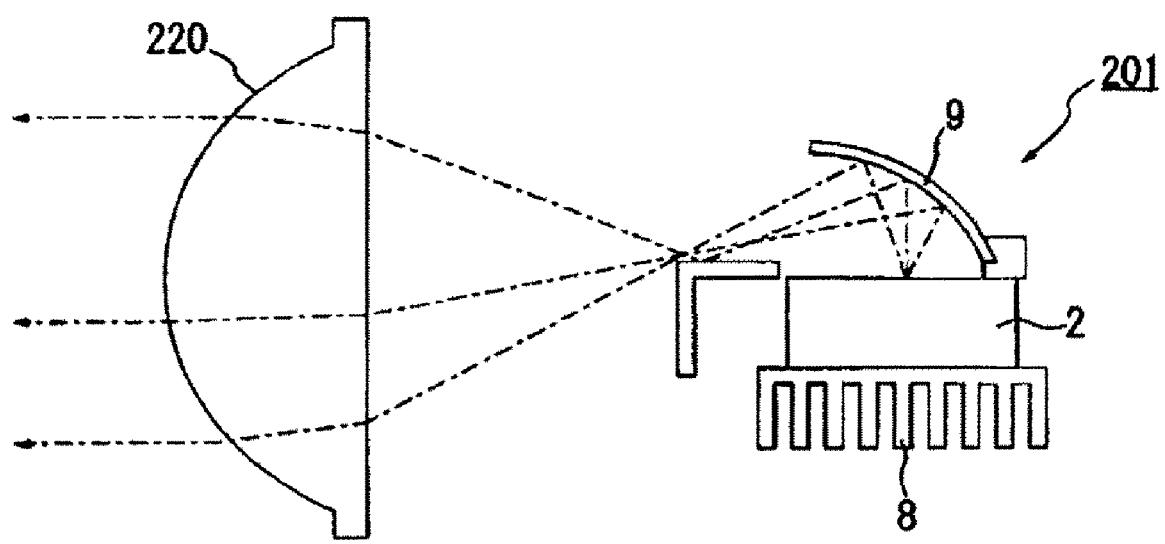
FIG. 9 is an explanatory view showing the internal structure of the headlight light emitting device of FIG. 8.

In the light emitting device 1 of the above-mentioned embodiment, the electric terminal part 4 is screwed into a socket. As shown in FIG. 7 through FIG. 9, however, it may be a light emitting device 201 used for a headlight 200a of a motor vehicle 200. The vehicle 200 as shown in FIG. 7 is an automobile equipped with headlights 200a on its front part. The light emitting device 201 for the headlight 200a as shown in FIG. 8 is not provided with an electric terminal part on the lower portion of the body 2. Instead, a heat sink 8 is connected to the bottom part 2b of the body 2. Also, on the upper portion of the body 2, a reflecting mirror 9 is provided for reflecting light exiting from opening 2a.

As shown in FIG. 9, white light reflected by the reflecting mirror 9 is converged in a predetermined direction by a lens 220. In this light emitting device 201, the heat sink 8 can be made small compared with a conventional resin sealing type LED headlight because the heat-resistant temperature is high. No problem occurs if the heat sink is not provided. It is also possible to connect the light emitting device 201 to a certain section of an automobile, thereby using the body of the automobile as a heat discharging member.

Figure 10:
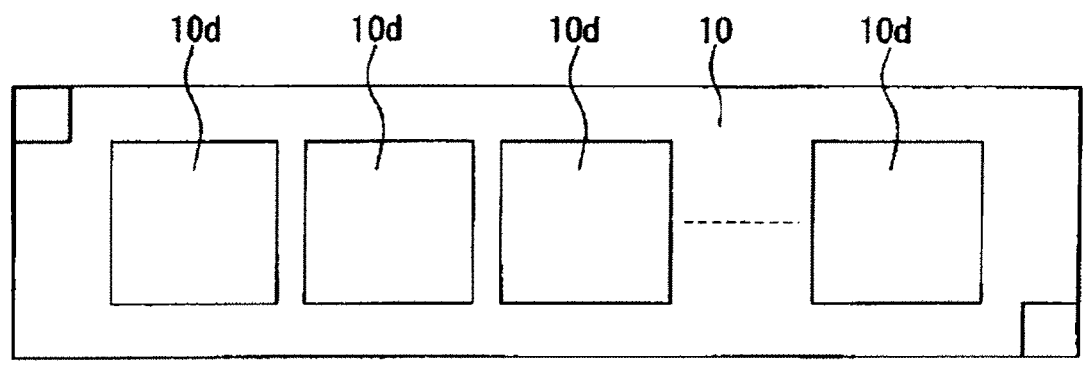
FIG. 10(a) is a plan view of a carrier substrate before LED elements are carried.
FIG. 10(b) is a side view of a carrier substrate at the time of mounting LED elements.
FIG. 10(c) is a side view of a carrier substrate after LED elements are mounted.
Figure 10:
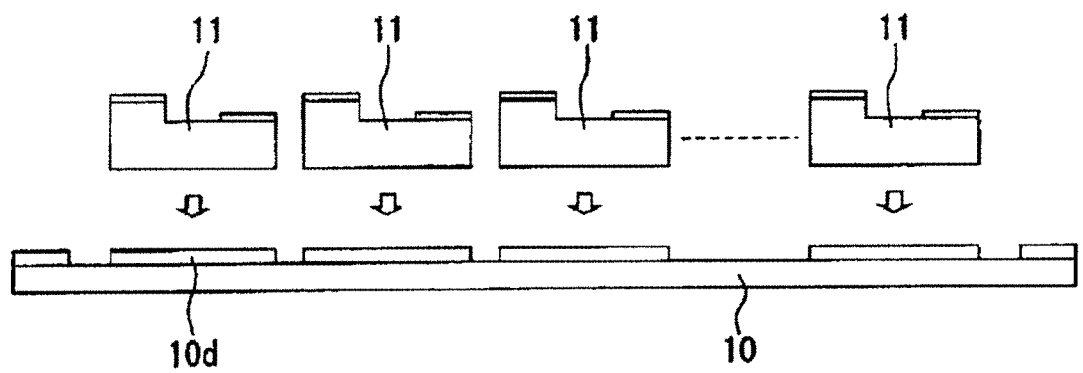
Figure 10:
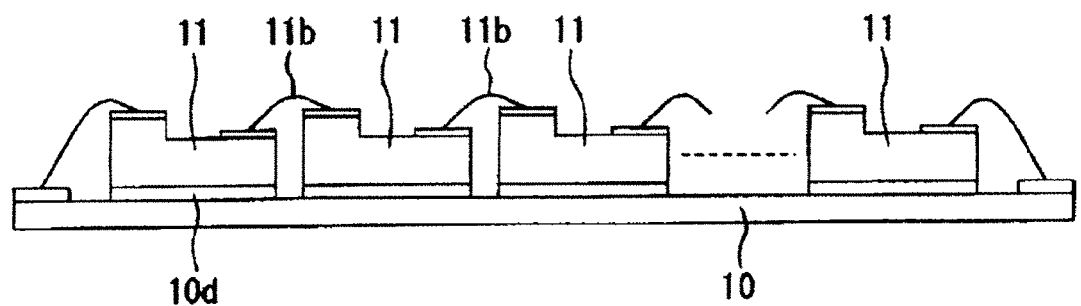

Furthermore, in the above-mentioned embodiment, an Au film 11a is formed on each LED element 11 and an Sn film 10b on the carrier substrate 10 to be bound. However, as shown in FIG. 10, AuSn solder 10d may be formed on the carrier substrate 10 in advance, and then, each LED element 11 is solder joined on the carrier substrate 10. Moreover, each LED element 11 is of the flip chip type as in the abovementioned embodiment. However, the LED elements may have a face up joint using a wire 11b as shown in FIG. 10, for example. Any known method for mounting LED elements can be used for mounting the LED elements 11, 12, 13, 14.

Furthermore, the above-mentioned embodiment shows an example of 41 UV LED elements 11, 2 blue LED elements 12, 4 green LED elements 13 and 2 red LED elements 14. However, any number of LED elements 11, 12, 13, 14 can be used. Moreover, it is not necessary to provide all of the blue LED elements 12, green LED elements 13 and red LED elements 14. For example, the percentage of red LED elements 14 can be increased without using blue LED elements 12 in order to generate warm white color. In order to generate cold white color, the percentage of blue LED elements 12 can be increased without using red LED elements 14. In other words, any emission wavelength can be used for each LED element so long as LED elements that emit UV radiation are used as the first LED elements and LED elements that emit visible light are used as the second LED element. Nevertheless, it is desirable that the peak wavelength of the first LED elements is 408 nm or shorter because the SiC fluorescent screen 3 is excited by radiation of 408 nm or shorter wavelengths and that the peak wavelength of the second LED elements exceeds 408 nm.

Furthermore, in the above-mentioned embodiment, LED elements 11, 12, 13, 14 are not sealed. However, they may be sealed by inorganic material, such as transparent glass. In this body, since the sealing material is inorganic, the heat resistance of the light emitting device 1 is not damaged in any way.

Furthermore, in the above-mentioned embodiment, the SiC fluorescent screen 3 is doped with both Al and B as acceptors. However, either one of Al and B may be used as an acceptor for doping. In the case of using only Al as an acceptor and N as a donor, fluorescent light having a peak wavelength in the blue region is emitted. In the case of using only B as an acceptor and N as a donor, fluorescent light having a peak wavelength in the yellow region is emitted. In other words, it is preferable to use only B as an acceptor in order to generate warm white color and only Al as an acceptor in order to generate cold white color.

Moreover, a reflecting film that reflects UV radiation may be formed on the surface of the SiC fluorescent screen 3 on the exit side. This reflecting film may be a multi-layered reflecting film (DBR film) made of inorganic material or a film made of inorganic material whose reflective index is higher than that of glass, for example. This method not only prevents UV radiation from exiting to the outside, but also enables reflection of UV radiation to the side of the SiC fluorescent screen 3 in order to convert its wavelength efficiently.

Furthermore, in the above-mentioned embodiment, the body 2, the electric terminal part 4 and the carrier substrate 10 are formed of AlN. However, an inorganic material with other properties can be used (e.g., Si and SiC). It is also possible to use wavelength conversion SiC doped with acceptor impurities and donor impurities. Nevertheless, it is preferred to use the same material in order to make the heat expansion coefficient consistent. It is noted that other specific details of the structure can appropriately be altered as well.

What is claimed is:

1. A light emitting device comprising:
   first LED elements for emitting UV light;
   second LED elements for emitting visible light;
   a substrate on which said first LED elements and said second LED elements are carried and which is made of inorganic material;
   a cage body which houses said first LED elements, said second LED elements and said substrate and which is made of an inorganic material; and
   a flat plate-shaped SiC fluorescent screen which is doped with at least one of B and Al and with N and which emits visible light when it is excited by the light emitted from said first LED elements,
   wherein said SiC fluorescent screen is arranged at a distance from said first LED elements and said second LED elements, and
   wherein said SiC fluorescent screen has a periodic structure, on a surface at which the light emitted from the first LED elements is incident, which is formed of a period that is smaller than the emission wavelength of the first LED elements.

2. The light emitting device according to claim 1, wherein the first LED elements emit radiation having a peak wavelength of 408 nm or less, and wherein the second LED elements emit radiation that have a peak wavelength that exceeds 408 nm.

3. The light emitting device according to claim 1, wherein the body has an opening, and wherein the SiC fluorescent screen extends across the opening.

4. The light emitting device according to claim 1, wherein a lens made of inorganic material is provided outside of the SiC fluorescent screen.

5. A light emitting device according to claim 1, wherein the second LED elements for emitting visible light comprise blue LED elements for emitting blue light, green LED elements for emitting green light, and red LED elements for emitting red light.

6. A light emitting device comprising:
first LED elements emitting UV light;
second LED elements emitting visible light;
an SiC fluorescent screen which is doped with at least one of B and Al and with N and which emits visible light when it is excited by the light emitted from said first LED elements; and
a substrate on which said first LED elements and said second LED elements are carried and which is made of an inorganic material;
wherein said SiC fluorescent screen is arranged at a distancet from said first LED elements and said second LED elements, and
wherein said SiC fluorescent screen has a periodic structure, on a surface at which the light emitted from the first LED elements is incident, which is formed by a period that is smaller than the emission wavelength of the first LED elements; and
an AuSn type alloy layer which connects said first LED elements and said second LED elements and which has columnar crystals extending approximately perpendicular to said substrate.

7. The light emitting device according to claim 6, comprising a body that contains the substrate and is made of inorganic material.

8. The light emitting device according to claim 6, wherein the peak wavelength of the first LED elements is 408 nm or less, and wherein the peak wavelength of the second LED elements exceeds 408 nm.

9. The light emitting device according to claim 6, wherein the second LED elements are blue LED elements, green LED elements and red LED elements.

10. A method for producing a light emitting device having:
first LED elements for emitting UV radiation;
second LED elements for emitting visible light;
an SiC fluorescent screen that is doped with at least one of B and Al as well as N and emits visible light when excited by radiation emitted from the first LED elements;
a substrate that carries the first LED elements and the second LED elements and is made of inorganic material; and
an AuSn type alloy layer that binds the first LED elements and the second LED elements with the substrate and comprises columnar crystals extending substantially perpendicular to the substrate,
comprising the steps of:
forming an Sn film on a carrying surface of the substrate;
forming an Au film on a mounting surface of the first LED elements and the second LED elements;
contacting the Au film formed on the first LED elements and the second LED elements with the Sn film formed on the carrying surface of the substrate; and
binding the first LED elements and the second LED elements to the substrate by heating the substrate in an atmosphere of forming gas containing a mixture of hydrogen gas and nitrogen gas with the Sn film and Au film in contact with each other.

11. The method for producing the light emitting device according to claim 10, wherein the Sn film and the Au film are contacted with each other in the contacting step by moving the carrying surface of the substrate upward and the mounting surface of the first LED elements and the second LED elements downward, and then mounting the first LED elements and the second LED elements on the substrate, and wherein the first LED elements and the second LED elements are bound to the substrate in the binding step by heating the substrate during mounting of the first LED elements and the second LED elements on the substrate.

* * * * *